United States Patent
Billingsley et al.

(10) Patent No.: US 8,520,349 B2
(45) Date of Patent: Aug. 27, 2013

(54) SUPPLY VOLTAGE MONITOR

(75) Inventors: Richard J. Billingsley, Rossland (CA); Robert A. Dawley, Creedmoor, NC (US)

(73) Assignee: Electronic Systems Protection, Inc., Knightdale, NC (US)

( * ) Notice: Subject to any disclaimer, the term of this patent is extended or adjusted under 35 U.S.C. 154(b) by 92 days.

(21) Appl. No.: 13/198,137

(22) Filed: Aug. 4, 2011

(65) Prior Publication Data

US 2012/0194955 A1     Aug. 2, 2012

Related U.S. Application Data

(60) Provisional application No. 61/438,022, filed on Jan. 31, 2011.

(51) Int. Cl.
*H02H 3/20* (2006.01)

(52) U.S. Cl.
USPC ............................................ 361/91.1; 361/92

(58) Field of Classification Search
USPC ........................................................ 361/91.1
See application file for complete search history.

(56) References Cited

U.S. PATENT DOCUMENTS

| | | | |
|---|---|---|---|
| 4,206,443 A * | 6/1980 | Britton | 340/3.43 |
| 4,414,601 A | 11/1983 | Conroy, Jr. | |
| 5,136,455 A | 8/1992 | Billingsley | |
| 5,440,441 A | 8/1995 | Ahuja | |
| 5,721,661 A | 2/1998 | Mechanic | |
| 5,956,222 A | 9/1999 | Wittner et al. | |
| 5,982,596 A * | 11/1999 | Spencer et al. | 361/64 |
| 6,040,969 A | 3/2000 | Winch et al. | |
| 6,118,639 A | 9/2000 | Goldstein | |
| 6,229,682 B1 | 5/2001 | Mechanic | |
| 6,560,086 B2 | 5/2003 | Mechanic | |
| 6,728,089 B2 | 4/2004 | Harford | |

(Continued)

FOREIGN PATENT DOCUMENTS

| | | |
|---|---|---|
| EP | 2071701 A1 | 6/2009 |
| EP | 2325988 A1 | 5/2011 |
| WO | 2007143576 A2 | 12/2007 |
| WO | 2009082484 A1 | 7/2009 |

OTHER PUBLICATIONS

Extended Search Report in counterpart EP Application No. 12000591.3, mailed May 8, 2012.

*Primary Examiner* — Jared Fureman
*Assistant Examiner* — Kevin J Comber
(74) *Attorney, Agent, or Firm* — Edell, Shapiro & Finnan, LLC

(57) ABSTRACT

A supply voltage monitor includes a switch circuit that enables coupling of an AC power supply to a load. A control circuit switches the switch circuit from a non-conductive state to a conductive state when a supply voltage signal is between a first over-voltage threshold and a first under-voltage threshold. The control circuit records an over-voltage event and maintains the switch circuit in the conductive state when the supply voltage signal exceeds a second, higher over-voltage threshold. The control circuit switches the switch circuit to a non-conductive state when the supply voltage signal exceeds a third, highest over-voltage threshold. The control circuit records an under-voltage event and maintains the switch circuit in the conductive state when the supply voltage signal falls below a second, lower under-voltage threshold. The control circuit switches the switch circuit to the non-conductive state when the supply voltage signal falls below a third, lowest under-voltage threshold.

20 Claims, 7 Drawing Sheets

(56) References Cited

U.S. PATENT DOCUMENTS

| | | |
|---|---|---|
| 6,744,613 B2 | 6/2004 | McCook et al. |
| 6,947,266 B1 | 9/2005 | Billingsley |
| 6,956,725 B2 | 10/2005 | Boughton, Jr. et al. |
| 7,068,487 B2 | 6/2006 | Harford |
| RE39,446 E | 12/2006 | Winch et al. |
| 7,184,252 B2 | 2/2007 | Harford |
| 7,511,934 B2 | 3/2009 | Benton et al. |
| 7,541,696 B2 * | 6/2009 | Dawley .......... 307/103 |
| 7,551,412 B2 | 6/2009 | Winch |
| 7,568,117 B1 * | 7/2009 | Fernald .......... 713/340 |
| 2007/0194942 A1 | 8/2007 | Darr |
| 2008/0247105 A1 * | 10/2008 | Divan .......... 361/56 |
| 2008/0258709 A1 | 10/2008 | Shuey |
| 2009/0116158 A1 | 5/2009 | Graves et al. |
| 2010/0067158 A1 * | 3/2010 | Saarinen .......... 361/91.1 |
| 2011/0063759 A1 | 3/2011 | Billingsley et al. |
| 2011/0313583 A1 | 12/2011 | Lin |

\* cited by examiner

SUPPLY VOLTAGE MONITOR

CROSS REFERENCE TO RELATED APPLICATION

This application claims priority under 35 U.S.C. §119(e) from U.S. Provisional Patent Application No. 61/438,022 entitled "Supply Voltage Monitor," filed Jan. 31, 2011. The disclosure of this provisional patent application is incorporated herein by reference in its entirety.

BACKGROUND

Many available power protection devices, such as surge protection devices (SPDs) and hybrid filters, include an automatic switch circuit that disconnects AC power to the device output in response to various supply wiring fault and/or over voltage or under voltage conditions. Circuitry that detects over voltage and under voltage conditions requires nominal line voltage levels before AC power is passed to the device output and connected equipment. Line voltage conditions, such as swells and over voltages, can cause failure of certain power protection device components such as metal oxide varistors and other suppressor components. In addition, some equipment power supplies can be damaged by continuous over voltage conditions. Under voltage conditions can result from malfunctions in connected equipment such as short circuits, leading to potentially damaging or dangerous high currents within the power protection device or the connected equipment itself.

Despite the benefits of power protection devices that disconnect power to equipment in response to fault conditions such as over voltage and under voltage conditions, the resulting power disruptions can be inconvenient or problematic in many circumstances. To avoid frequent power interruptions, one solution would be to set the voltage levels at which power is disconnected well outside the normal operation range but still within levels tolerated by the equipment. However, this approach may result in frequent or chronic over voltage or under voltage conditions of lesser magnitude going undetected indefinitely, which may eventually lead to damage to the surge protection device or the connected equipment. Accordingly, there remains a need for a supply voltage monitoring system that provides over voltage and under voltage protection without causing frequent power disruptions while still providing adequate notification of lesser-magnitude over voltage and under voltage conditions that may indicate a problem condition within the system or with the connected equipment.

SUMMARY

Described herein is a supply voltage monitoring device for monitoring over voltage conditions of an AC power supply. The monitoring device includes a switch circuit, a supply signal conditioning circuit, and a control circuit. The switch circuit selectively couples an input conductor connectable to the AC power supply to an output conductor connectable to a load. For example, the switch circuit can lie along the path between the input and output line conductors of the monitoring device. In a conductive state, the switch circuit electrically connects the input conductor to the output conductor and, in a non-conductive state, the switch circuit electrically disconnects the input conductor from the output conductor. The supply signal conditioning circuit generates a supply voltage signal representative of a voltage of the AC power supply. For example, the supply voltage signal can be proportional to the input line-to-neutral voltage of the AC power supply. The control circuit monitors the supply voltage signal for over voltage conditions and controls the switch circuit and records over voltage events in response to certain conditions.

In particular, when the switch circuit is in the non-conductive state, the control circuit controls the switch circuit to switch to the conductive state in response to the supply voltage signal being between a first "restore" over voltage threshold and a first "restore" under voltage threshold. Once the switch circuit is in the conductive state, the control circuit records an over voltage event and maintains the switch circuit in the conductive state in response to the supply voltage signal exceeding a second "record" over voltage threshold that is higher than the restore over voltage threshold. Further, the control circuit controls the switch circuit to switch from the conductive state to the non-conductive state and records another over voltage event in response to the supply voltage signal exceeding a third "shutdown" over voltage threshold that is higher than the record over voltage threshold. Recording an over voltage event includes incrementing an over voltage event counter and recording a timing of the over voltage event.

Similarly, once the switch circuit is in the conductive state, the control circuit records an under voltage event and maintains the switch circuit in the conductive state in response to the supply voltage signal falling below a second "record" under voltage threshold that is lower than the restore under voltage threshold. Further, the control circuit controls the switch circuit to switch from the conductive state to the non-conductive state and records another under voltage event in response to the supply voltage signal falling below a third "shutdown" under voltage threshold that is lower than the record under voltage threshold.

The above and still further features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

DETAILED DESCRIPTION

The supply voltage monitor described herein employs a plurality of voltage threshold levels to monitor the voltage of an AC supply coupled to load equipment and performs different operations depending on which, if any, of the thresholds have been crossed. For example, if an AC supply voltage exceeds a "record" over voltage threshold, the event is recorded and can be reviewed and evaluated either in real time or at some later point in time to determine if a problem condition has developed. If the AC supply voltage exceeds a higher "shutdown" over voltage threshold, the event is recorded and the load equipment is disconnected from the AC supply to protect the load equipment and the monitoring device itself. Likewise, if the AC supply voltage falls below a "record" under voltage threshold, the event is recorded, and if the AC supply voltage falls below a lower "shutdown" under voltage threshold, the event is recorded and the equipment is disconnected from the AC supply. In this manner, the load equipment and the monitoring device are immediately protected from serious over voltage and under voltage conditions, while lesser over voltage and under voltage conditions can be monitored without causing an immediate power disruption. If persistent, lower-level under voltage and over-voltage conditions are observed, corrective measures can be taken at a convenient time.

Figure 1:
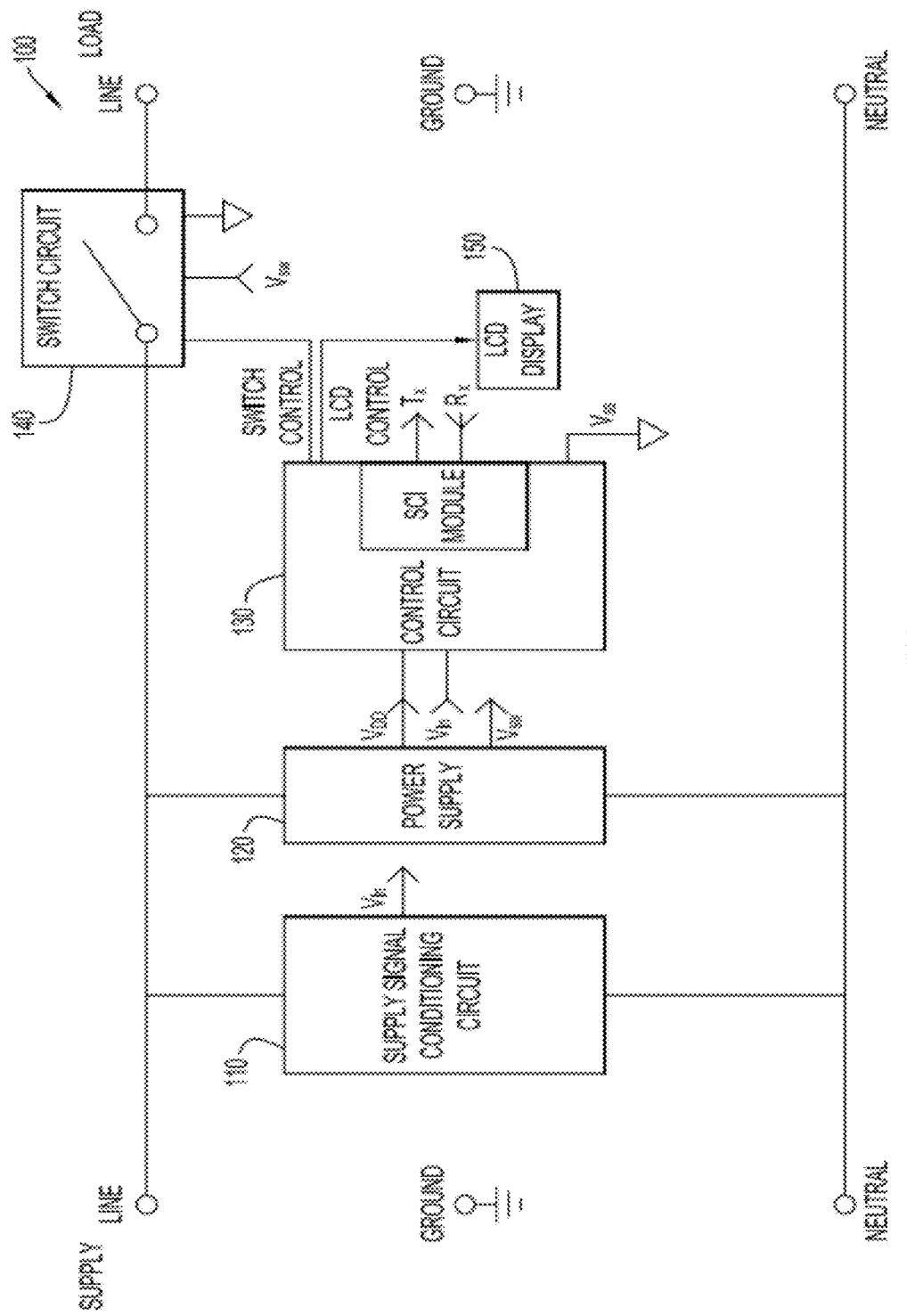
FIG. 1 is a block diagram of an embodiment of a supply voltage monitoring device capable of selectively connecting an AC power supply to load equipment.

FIG. 1 is a block diagram of an embodiment of a supply voltage monitoring device 100 capable of selectively connecting an AC power supply to load equipment. As will be explained in greater detail, supply voltage monitoring device 100 can be incorporated into a wide range of power protection and conditioning devices, such as surge protection devices (SPDs) and hybrid filters that perform a variety of other functions for ensuring delivery of reliable power to load equipment.

As shown in FIG. 1, on the supply side, input line, neutral, and ground terminals of device 100 are configured to be coupled to corresponding terminals of an AC power supply system (e.g., the terminals can be implemented as a plug configured to be inserted into an AC power socket). On the load side, output line, neutral, and ground terminals are configured to be coupled to corresponding terminals of one or more load devices. Line and neutral conductors of the device provide paths between the input and output line and neutral terminals, respectively.

A switch circuit 140 is disposed along the line conductor path and selectively couples an input (supply) line conductor to an output (load) line conductor between the input and output line terminals. In a conductive state, switch circuit 140 electrically connects the input line conductor to the output line conductor and, in a non-conductive state, switch circuit 140 electrically disconnects the input line conductor from the output line conductor. Switch circuit 140 can be implemented using any of a wide variety of switching mechanisms. According to one option, switch circuit 140 can comprise an electromagnetic relay (EMR) in which a relay coil voltage is applied to close normally-open relay contacts to thereby make/break line continuity between the input and output line conductors and selectively pass AC power to the monitoring device output and connected equipment. According to another option, switch circuit 140 can be implemented with a power semiconductor, such as a triac.

According to yet another option, switch circuit 140 can be implemented with a hybrid switch circuit involving a parallel combination of a power semiconductor and an electromagnetic relay, such as that described in U.S. Patent Application Publication No. 2011/0063759, the disclosure of which is hereby incorporated by reference in its entirety. With this configuration, zero cross switching can be realized with minimal on-state voltage drop and power dissipation. Designed correctly, automatic switch circuits controlled in response to over voltage and under voltage conditions can protect vulnerable downstream device components (e.g., metal oxide varistors (MOVs) and other suppressor components) from over voltage and under voltage related damage. In addition to protecting vulnerable device components, these circuits can also protect connected equipment that might otherwise be damaged by the over voltage or under voltage condition.

While switch circuit 140 shown in FIG. 1 is arranged to make/break the connection between the input and output line conductors, optionally, a switch circuit controlled in the same manner could be arranged between input and output neutral conductors or switches could be place in both the line and neutral paths of device 100.

A supply signal conditioning circuit 110 is coupled to the input (supply-side) line and neutral conductors of device 100 and develops from these AC power supply signals a supply voltage signal $V_{In}$ that is representative of the input line-to-neutral voltage for processing by a control circuit 130. Control circuit 130 can be, for example, a microcontroller. The characteristics of the supply voltage signal $V_{In}$ depend on the particular configuration of the microcontroller employed. For example, for a microcontroller configured to receive an AC voltage signal, supply signal conditioning circuit 110 can generate the supply voltage signal $V_{In}$ as a stepped-down version of the line-to-neutral voltage. For a microcontroller configured to receive a DC voltage signal, supply signal conditioning circuit 110 can generate the supply voltage signal $V_{In}$ as a DC signal (e.g., an analog signal) whose value is in an operating range of the microcontroller and proportional to the peak supply line-to-neutral voltage. For example, supply signal conditioning circuit 110 can be a simple voltage divider, which would require a differential A/D input at control circuit 130. If control circuit 130 has a standard 0 to $V_{dd}$ type of A/D input, then supply signal conditioning circuit 110 would include a type of peak-detect circuit. While the embodiment described herein employs a representation $V_{In}$ of the supply line-to-neutral voltage to detect over voltage and under voltage conditions, according to another option, a signal representative of the line-to-ground voltage $V_{lg}$ could be generated and used for this purpose.

A power supply circuit 120 is coupled to the supply-side line and neutral conductors of device 100 and generates DC voltage signals required to operate control circuit 130 and switch circuit 140. In the example shown in FIG. 1, a first DC power supply voltage $V_{DD}$ is generated and supplied to control circuit 130, while a second DC power supply voltage $V_{SW}$ is generated and supplied to switch circuit 140. Although power supply 120 generates these DC voltages from the input line-to-neutral AC signal, power supply 120 can be a regulated DC supply that maintains its DC output (i.e., regulates its output) very close to a nominal level with variations of the AC input voltage. To maintain the DC voltage level constant with variations in the supply voltage, some form of regulation is employed. For example, a Zener regulator can be used which comprises a current limiting resistor in series with one or more Zener diodes. The voltage across the Zener diode varies only slightly with orders of magnitude changes in the current through the device. Other ways of regulating the DC output voltages over a range in AC supply voltage may include pulse width modulation and feedback methods.

Control circuit 130 includes a processor (e.g., a microprocessor, a microcontroller, a digital signal processor, etc.) capable of executing program instructions (i.e., software) for carrying out various operations and tasks. For example, control circuit 130 can interpret received data and commands, perform computations, cause information to be stored, and control switch circuit 140 and a display 150 of device 100.

Display 150 can be any of a variety of display mechanisms (e.g., an LCD display, an LED display, etc.) that provides a visual indication of supply voltage monitoring information and can be located, for example, along a portion of the outer housing or casing of device 100 that can readily be viewed during operation.

Control circuit 130 further includes a storage capability that can store information relating to over voltage and under voltage conditions, event count information, timing information, and other data or information. The storage or memory of control circuit 130 can also store program instructions (i.e., software) to be executed by the processor of control circuit 130 to carry out operations. Thus, the operations and methodologies described herein can be carried out by executing instructions stored on a non-transitory computer readable medium (i.e., software) on a processor or processors of control circuit 130. As used herein, the term "computer readable medium" refers to non-transitory (tangible) media (e.g., memory or storage devices). The storage/memory of control circuit 130 is a tangible processor-readable or computer-readable memory that stores or is encoded with instructions that, when executed by the processor of control circuit 130, cause the processor to perform the functions described herein. While control circuit 130 can be implemented with a programmed microprocessor that executes stored software, an alternative processing environment is a fixed data processing element, such as an application specific integrated circuit (ASIC) that is configured, through fixed hardware logic, to perform the functions of the logic. Yet another possible data processing environment is one involving one or more field programmable logic devices, or a combination of fixed processing elements, firmware, and/or programmable logic devices. The storage of control circuit 130 can also include a non-volatile memory, such as an EEPROM, configured to store event information such as counts of over voltage and under voltage events and timing information relating thereto.

Control circuit 130 is powered by the supply voltage $V_{DD}$ generated by power supply 120 and receives the representation of the line-to-neutral voltage $V_{In}$ for the purpose of evaluating whether an under voltage or over voltage condition exists. Control circuit 130 supplies a switch control signal to switch circuit 140 and a display control signal to display 150 in response to the received supply voltage signal $V_{In}$. For example, control circuit 130 can drive display 150 to display over voltage and under voltage event count information. As described below, if an over voltage or under voltage condition is potentially damaging to the connected equipment, the microcontroller signals supplies the switch control signal to switch circuit 140 to disconnect power to the device output receptacles and protected equipment.

In the example shown in FIG. 1, control circuit 130 also includes a serial communication interface (SCI) that allows for transmission of data (e.g., status and event history) from control circuit 130 to an external device and transmission of data (e.g., control parameters) from an external device to control circuit 130.

Control circuit can also include a timer module configured to keep track of time (e.g., seconds, minutes, hours, and days, etc.). For example, timer module can maintain a running clock or provide an elapsed time since a last event, thereby enabling a reference time to be recorded and stored for over voltage and under voltage events.

According to an example implementation in which the supply voltage signal $V_{In}$ is an analog DC signal proportional to the input line-to-neutral conductor, the firmware or software of control circuit 130 periodically performs an analog-to-digital (A/D) conversion on the supply voltage signal $V_{In}$ in order to convert it to a digital signal, represented as a hexadecimal "Hex" value, for example. This Hex value, which is directly proportional to the supply voltage, can then be compared to various stored threshold values (e.g., stored in firmware): $OV_{restore}$ (over voltage restore), $OV_{record}$ (over voltage record), $OV_{shutdown}$ (over voltage shutdown) $UV_{restore}$ (under voltage restore), $UV_{record}$ (under voltage record), and $UV_{shutdown}$ (under voltage shutdown). Control circuit 130 determines whether the supply voltage is acceptable or if an under voltage (UV) or over voltage (OV) condition exists based on the value of the supply voltage signal $V_{In}$ in relation to these stored threshold values. By way of example, for a U.S. power supply, default "firmware" Hex values can correspond to the following supply voltage levels:

| | |
|---|---|
| $OV_{shutdown}$ ($OV_{sh}$) | 150 Vrms |
| $OV_{record}$ ($OV_{rc}$) | 135 Vrms |
| $OV_{restore}$ ($OV_{rs}$) | 130 Vrms |
| $UV_{restore}$ ($UV_{rs}$) | 105 Vrms |
| $UV_{record}$ ($UV_{rc}$) | 100 Vrms |
| $UV_{shutdown}$ ($UV_{sh}$) | 80 Vrms |

Figure 2:
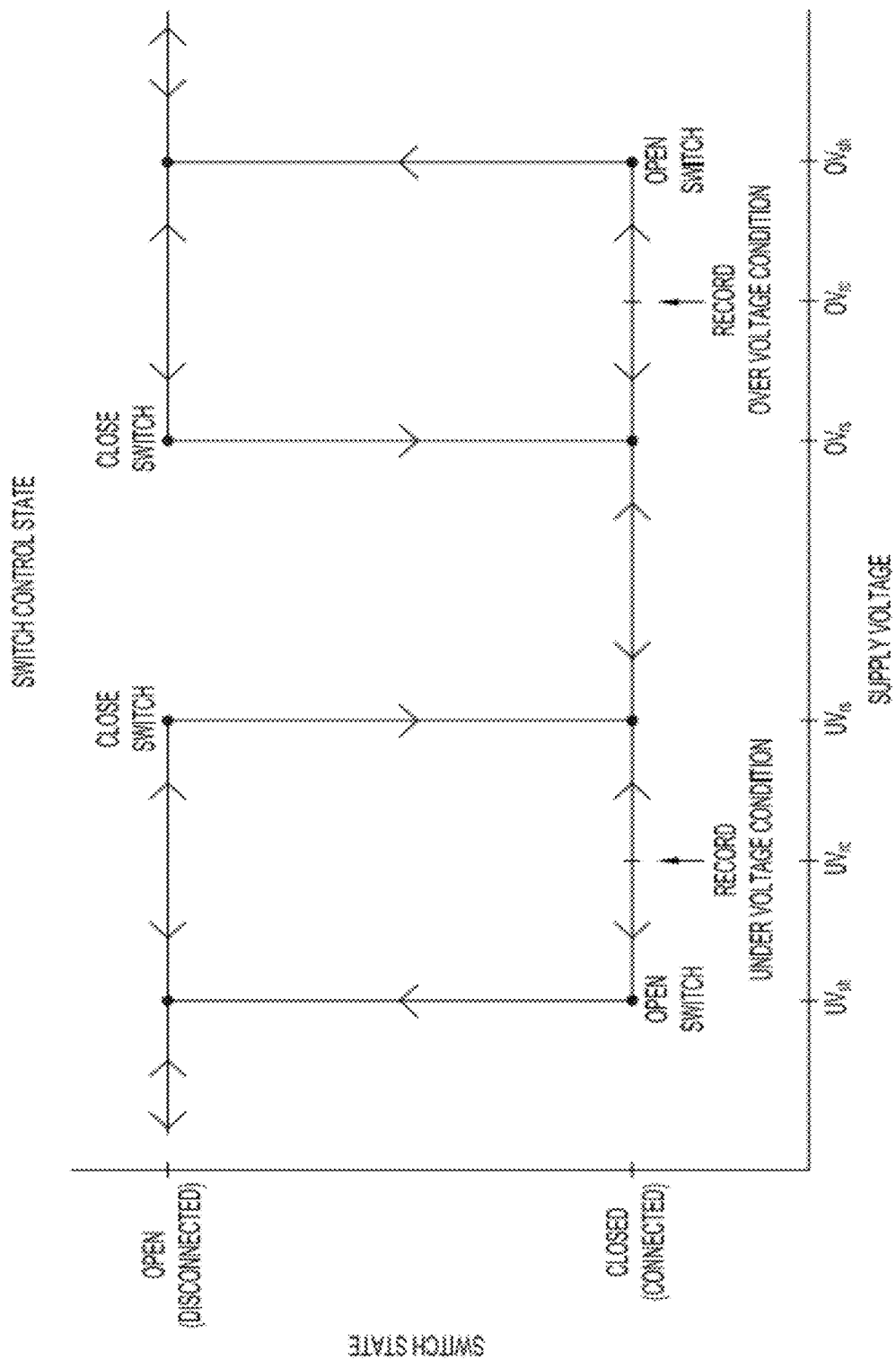
FIG. 2 is a graph illustrating the switch circuit state of the supply voltage monitoring device of FIG. 1 as a function of supply voltage levels.
Figure 3:
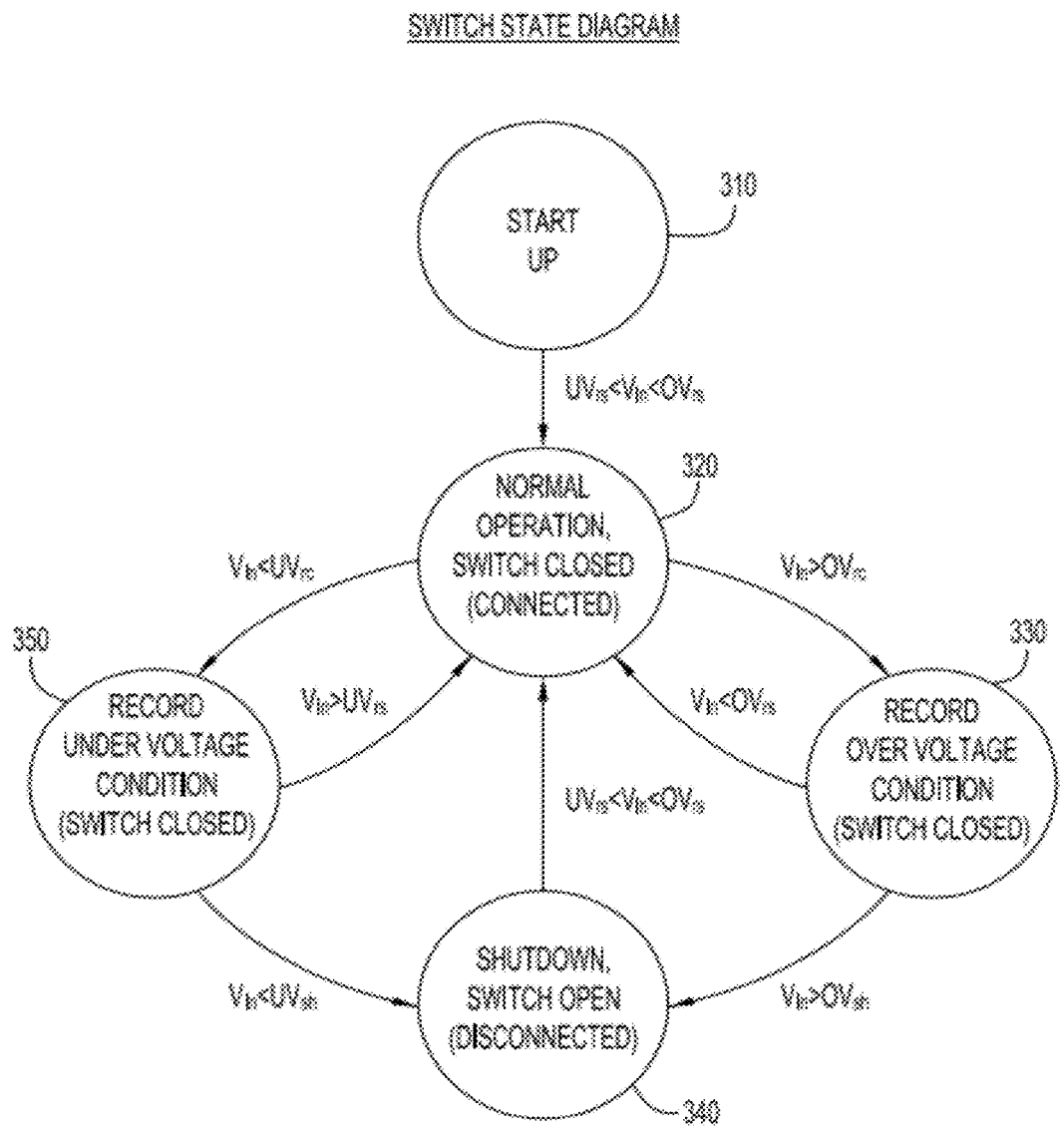
FIG. 3 is a state diagram illustrating operational states of the supply voltage monitoring device of FIG. 1.

Operation of control circuit 130 in relation to these thresholds is described in connection with the graph of FIG. 2 illustrating the switch circuit state of supply voltage monitoring device 100 as a function of supply voltage levels and in connection with the state diagram of FIG. 3 illustrating operational states of supply voltage monitoring device 100. For consistency, the operators $<$, $>$, $\leq$, and $\geq$ are employed in the follow description when referring to comparison between the supply voltage signal $V_{In}$ and the various thresholds. However, it will be understood that the invention is not limited to any particular implementation of how to determine when a threshold has been reached (i.e., whether a threshold is met by exceeding/falling below the threshold or merely by being equal to the threshold). Thus, the symbols $<$ and $\leq$ can be used interchangeably and the symbols $>$ and $\geq$ can be used interchangeably within the scope of the invention.

The over voltage and under voltage restore threshold levels ($OV_{rs}$ and $UV_{rs}$) respectively represent the upper and lower bounds of what is considered the "normal" range of operating voltages (i.e., neither an over voltage nor an under voltage condition). For example, an AC supply voltage that is in the range of 105 Vrms to 130 Vrms would be considered sufficiently close to the nominal supply voltage level of 120 Vrms to be considered acceptable.

On Start-Up (state 310 in FIG. 3), if the representation of the supply voltage signal $V_{In}$ is acceptable (i.e., between the over voltage and under voltage restore thresholds, $UV_{rs}$ and $OV_{rs}$), then control circuit 130 executes an "on-cycle" routine that transitions device 100 to a Normal Operation State 320. In this case, control circuit 130 supplies to switch circuit 140 a switch control signal in an "on" state that causes switch circuit 140 to turn on (close), i.e., switch to the conductive state, to connect the input supply line conductor to the output load line conductor, thereby passing power to the downstream device output receptacles and connecting load equipment to the AC power supply. This switch control state is reflected in the lower middle portion of FIG. 2, where the switch state is closed (connected/conductive) and the supply voltage signal $V_{In}$ is between $UV_{rs}$ and $OV_{rs}$.

If, on Start-Up, the supply voltage signal $V_{In}$ is outside of the restore threshold levels (i.e., $V_{In} > OV_{rs}$ or $V_{In} < UV_{rs}$), then control circuit 130 loops and continues to test the supply voltage signal $V_{In}$ until it is within these acceptable levels (i.e., $UV_{rs} \leq V_{In} \leq OV_{rs}$) before it executes the on-cycle routine and transitions to the Normal Operation State 320.

In the Normal Operation State 320, control circuit 130 continues to periodically execute an A/D conversion of the received supply voltage signal $V_{In}$ to determine whether the supply voltage is acceptable or whether some degree of over voltage or under voltage condition has developed. Referring again to FIG. 3, if the supply voltage signal $V_{In}$ rises to the point where it exceeds the over voltage record threshold $OV_{rc}$, then control circuit 130 responds to this condition by transitioning to the Record Over Voltage Condition State 330 and executing an "over voltage record" routine. A count of over voltage events is stored in the non-voltage memory of control circuit 130. The over voltage record routine includes incrementing the over voltage count and storing the incremented count value. Further, the over voltage record routine determines the time indicated by the timer module and records this value as the timing of the over voltage event. The recorded time can be an elapsed time since the last event, an elapsed time since the beginning of a timing period or interval, or a time of day. Optionally, control circuit 130 can send a display control signal to display device 150 to display the incremented over voltage count value. Further, via the SCI module, control circuit 130 can send a message to an external device containing the over voltage event information (e.g., count value and timing information).

In the Record Over Voltage State 330 shown in FIG. 3, even though an over voltage event is recorded, control circuit 130 continues to control switch circuit 140 to remain closed (conductive state) and the load equipment remains connected to the AC power supply. This conductive switch state can be seen in the lower right portion of FIG. 2 as a function of the supply voltage signal $V_{In}$. As the supply voltage exceeds over voltage restore level ($OV_{rs}$), no action is taken and switch circuit 140 remains closed (connected). If the supply voltage signal continues to rise and exceeds the over voltage record threshold ($OV_{rc}$), the over voltage record routine is executed (e.g., increment count, record time, control display, supply external notification); however, the switch control signal supplied to switch circuit 140 remains in the on (conductive) state (i.e., the switch control signal causes switch circuit 140 to continue to be closed).

It is possible that the supply voltage may fluctuate above and below the over voltage record threshold ($OV_{rc}$) over a short period of time. According to the state diagram shown in FIG. 3, to prevent this condition from generating a rapid series of over voltage reports, the supply voltage signal must drop back below the over voltage restore threshold ($V_{In} < OV_{rs}$), such that device 100 returns to the Normal Operation State 320, before another over voltage record operation can be executed in response to the supply voltage signal exceeding the over voltage record threshold ($V_{In} > OV_{rc}$). In other words, once device 100 is in the Record Over Voltage Condition State 330, no further over voltage conditions will be recorded unless device 100 first returns to the Normal Operation State 320 and then again transitions to the Record Over Voltage Condition State 330 or unless device 100 transitions to the Shutdown State 340 as described below. According to another possible implementation, once in the Record Over Voltage Condition State 330, the supply voltage signal $V_{In}$ can be periodically evaluated and, if the supply voltage signal remains above the over voltage record threshold ($OV_{rc}$), another over voltage record routine can be executed, resulting in periodic reports.

Referring again to FIG. 3, from the Record Over Voltage Condition State 330, if the supply voltage signal rises above the over voltage shutdown threshold ($V_{In} > OV_{sh}$), then device 100 transitions to the Shutdown State 340. In this case, in addition to again executing the over voltage record routine, control circuit 130 also executes an "off-cycle" routine in which the switch control signal changes to an off state, causing switch circuit 140 to switch to the non-conductive or "off" state (open), thereby disconnecting power to the device output receptacles and protected equipment. For example, in the case of an electromagnetic relay switch, control circuit 130 will signal switch circuit 140 to remove relay coil voltage, causing the normally-open relay contacts of the relay to open, thereby disconnecting AC power to downstream components and connected equipment. This operation is reflected in the rightmost portion of the switch state graph of FIG. 2 in which switch circuit 140 transitions from a conductive/closed (equipment connected) state to a non-conductive/open (equipment disconnected) state.

According to one option, events in which the supply voltage signal exceeds the over voltage shutdown threshold ($V_{In} > OV_{sh}$) can be recorded separately from events in which the supply voltage signal merely exceeds the over voltage record threshold but not the over voltage shutdown threshold ($OV_{rc} < V_{In} \leq OV_{sh}$), e.g., two different over voltage counts can be maintained, one for exceeding only the lower over voltage record threshold and one for exceeding the higher over voltage shutdown threshold.

As shown in FIG. 2, once device 100 is in the Shutdown State 340 (after execution of the off-cycle routine), switch circuit 140 remains non-conductive/open (power supply disconnected) even if the supply voltage signal $V_{In}$ falls below the over voltage shutdown threshold level $OV_{sh}$ or even if the supply voltage signal $V_{In}$ falls below the over voltage record threshold level $OV_{rc}$. To transition back to the Normal Operation State 320, the supply voltage signal $V_{In}$ must drop to a point between the over voltage and under voltage restore thresholds ($UV_{rs} \leq V_{In} \leq OV_{rs}$) before control circuit 130 will once again execute the on-cycle routine in which the switch control signal changes to an on state, thereby controlling switch circuit 140 to close and become conductive to pass power to the protected equipment. For example, in the case of an electromagnetic relay switch, control circuit 130 will signal switch circuit 140 to energize the relay, causing the normally-open contacts to close, thereby passing AC power to downstream device components and connected equipment. Since switch circuit 140 shuts off when the supply voltage signal $V_{In}$ exceeds the higher over voltage shutdown threshold $OV_{sh}$ but does not turn back on until the supply voltage signal $V_{In}$ falls below the lower over voltage restore threshold $OV_{rs}$, hysteresis is built into the switch control mechanism, which prevents rapid on-and-off cycles in response to a fluctuating supply voltage.

Summarizing operation of control circuit 130 in relation to the over voltage thresholds, in response to the supply voltage signal $V_{In}$ being below a first (restore) over voltage threshold and switch circuit 140 being in the non-conductive state, control circuit 130 controls switch circuit 140 to switch to the conductive state. In response to the supply voltage signal $V_{In}$ exceeding a second (record) over voltage threshold that is higher than the first over voltage threshold and switch circuit 140 being in the conductive state, control circuit 130 records an over voltage event and controls switch circuit 140 to remain in the conductive state. In response to the supply voltage signal $V_{In}$ exceeding a third (shutdown) over voltage threshold that is higher than the second over voltage threshold and switch circuit 140 being in the conductive state, control circuit 130 controls switch circuit 140 to switch to the non-conductive state and, optionally, records this an another over voltage event.

Similarly, if from the Normal Operation State 320, the periodically monitored supply voltage signal $V_{In}$ falls to the point where it is lower than the under voltage record threshold $UV_{rc}$ ($V_{In} < UV_{rc}$), then control circuit 130 responds to this condition by transitioning to the Record Under Voltage Condition State 350 and executing an under voltage record routine. A count of under voltage events is stored in the non-volatile memory of control circuit 130. The under voltage record routine includes incrementing the under voltage count and storing the incremented count value. Further, the under voltage record routine determines the time indicated by the timer module and records this value as the timing of the under voltage event. As with the over voltage events, the recorded under voltage event time can be, an elapsed time since the last event, an elapsed time since the beginning of a timing period or interval, or a time of day. Optionally, control circuit 130 can send a display control signal to display device 150 to display the incremented under voltage count value. Further, via the SCI module, control circuit 130 can send a message to an external device containing the under voltage event information (e.g., count value and timing information).

In the Record Under Voltage State 330 shown in FIG. 3, even though an under voltage event is recorded, switch circuit 140 remains conductive/closed and the load equipment remains connected to the AC power supply. This switch state can be seen in the bottom left portion of FIG. 2 as a function of the supply voltage signal. As the supply voltage signal falls below the under voltage restore threshold ($UV_{rs}$), no action is taken and switch circuit 140 remains closed (connected). If the supply voltage signal continues to fall and drops below the under voltage record threshold ($UV_{rc}$), the under voltage record routine is executed (e.g., increment count, record time, control display, supply external notification); however, the switch control signal supplied to switch circuit 140 remains in the on (conductive) state (i.e., the switch control signal causes switch circuit 140 to continue to be closed).

It is possible that the supply voltage signal may fluctuate above and below the under voltage record threshold ($UV_{rc}$) over a short period of time. According to the state diagram shown in FIG. 3, to prevent this condition from generating a rapid series of under voltage reports, the supply voltage signal must exceed the under voltage restore threshold ($V_{In} > UV_{rs}$), such that device 100 returns to the Normal Operation State 320, before another under voltage record operation can be executed in response to the supply voltage signal falling below the under voltage record threshold ($V_{In} < UV_{rc}$). In other words, once device 100 is in the Record Under Voltage Condition State 350, no further under voltage conditions will be recorded unless device 100 first returns to the Normal Operation State 320 and then again transitions to the Record Under Voltage Condition State 350 or unless device 100 transitions to the Shutdown State 340. According to another possible implementation, once in the Record Under Voltage Condition State 350, the supply voltage signal $V_{In}$ can be periodically evaluated and, if the supply voltage signal remains below the under voltage record threshold ($UV_{rc}$), another under voltage record routine can be executed, resulting in periodic reports.

Referring again to FIG. 3, from the Record Under Voltage Condition State 350, if the supply voltage signal falls below the under voltage shutdown threshold ($V_{In} < UV_{sh}$), then device 100 transitions to the Shutdown State 340. In this case, in addition to again executing the under voltage record routine, control circuit 130 also executes an off-cycle routine in which the switch control signal changes to an off state, causing switch circuit 140 to transition to a non-conductive state or turn "off" (open switch), thereby disconnecting power to the device output receptacles and protected equipment. This operation is reflected in the leftmost portion of the switch state graph of FIG. 2 in which switch circuit 140 transitions from a conductive/closed (equipment connected) state to an non-conductive/open (equipment disconnected) state.

According to one option, events in which the supply voltage signal falls below the under voltage shutdown threshold ($V_{In} < UV_{sh}$) can be recorded separately from events in which the supply voltage signal merely falls below the under voltage record threshold but not the under voltage shutdown threshold ($UV_{sh} < V_{In} \leq UV_{rc}$), e.g., two different under voltage counts can be maintained, one for falling below only the higher under voltage record threshold and one for falling below the lower under voltage shutdown threshold.

As shown in the upper left portion of FIG. 2, once device 100 is in the Shutdown State 340 (after execution of the off-cycle routine), switch circuit 140 remains non-conductive/open (power supply disconnected) even if the supply voltage signal $V_{In}$ exceeds the under voltage shutdown threshold $UV_{sh}$ or even if the supply voltage signal $V_{In}$ exceeds the under voltage record threshold $UV_{rc}$. To transition back to the Normal Operation State 320, the supply voltage signal $V_{In}$ must rise to a point between the under voltage and over voltage restore thresholds ($UV_{rs} \leq V_{In} \leq OV_{rs}$) before control circuit 130 will once again execute the on-cycle routine in which the switch control signal changes to an on state, thereby controlling switch circuit 140 to switch to a conductive stated (closed) and pass power to the protected equipment. Since switch circuit 140 shuts off when the supply voltage signal $V_{In}$ falls below the under voltage shutdown threshold $UV_{sh}$ but does not turn back on until the supply voltage signal $V_{In}$ exceeds the under voltage restore threshold $UV_{rs}$, hysteresis is built into the switch control mechanism, which prevents rapid on-and-off cycles in response to a fluctuating supply voltage.

Summarizing operation of control circuit 130 in relation to the under voltage thresholds, in response to the supply voltage signal $V_{In}$ being above a first (restore) under voltage threshold and switch circuit 140 being in the non-conductive state, control circuit 130 controls switch circuit 140 to switch to the conductive state. In response to the supply voltage signal $V_{In}$ being below a second (record) under voltage threshold that is lower than the first under voltage threshold and switch circuit 140 being in the conductive state, control circuit 130 records an under voltage event and controls switch circuit 140 to remain in the conductive state. In response to the supply voltage signal $V_{In}$ being below a third (shutdown) under voltage threshold that is lower than the second under voltage threshold and switch circuit 140 being in the conductive state, control circuit 130 controls switch circuit 140 to switch to the non-conductive state and, optionally, records this an another under voltage event.

Figure 4A:
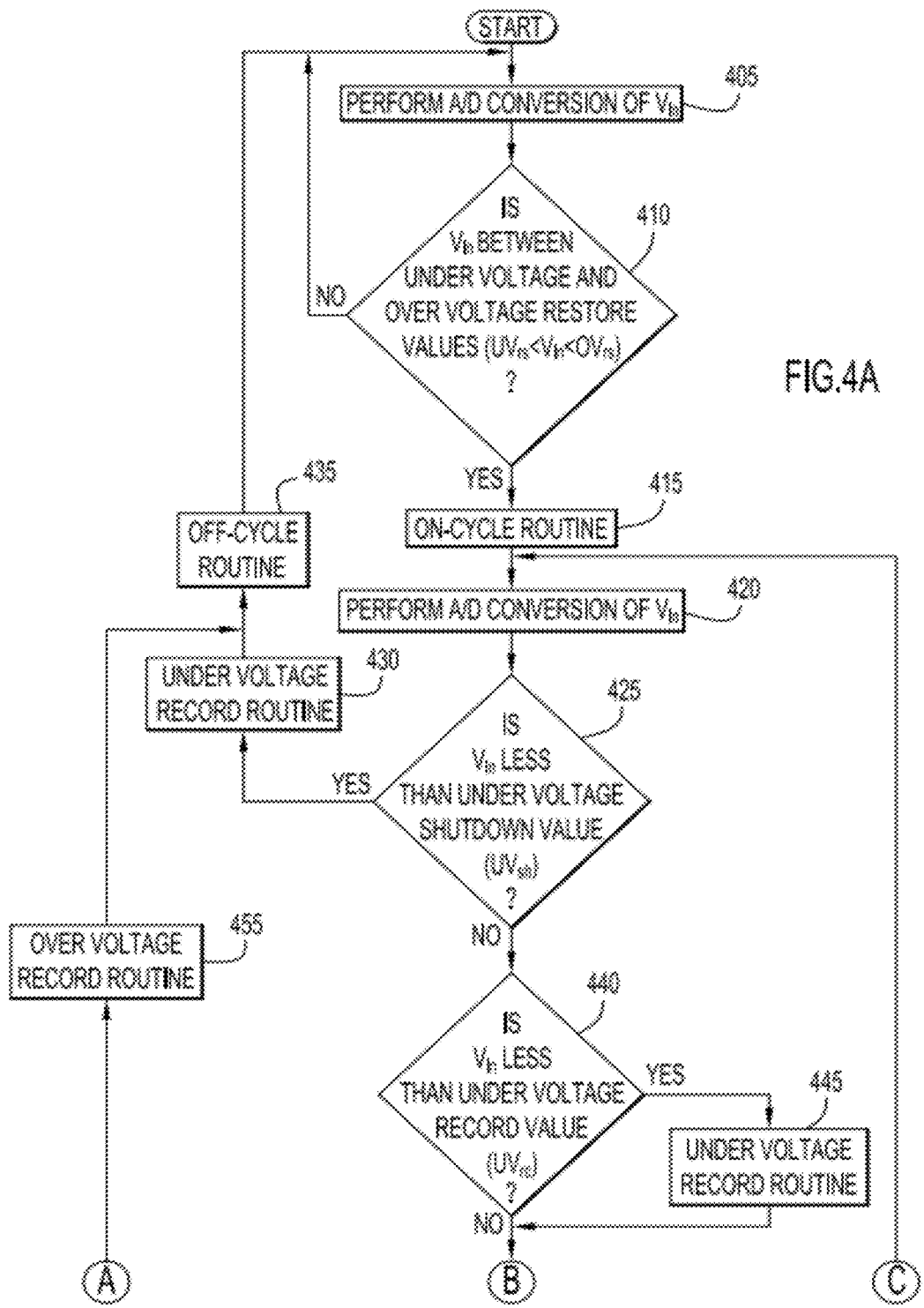
FIGS. 4A and 4B depict a functional flow diagram of one example of logic for implementing operation of the supply voltage monitoring device of FIG. 1 in response to supply voltage conditions.
Figure 4B:
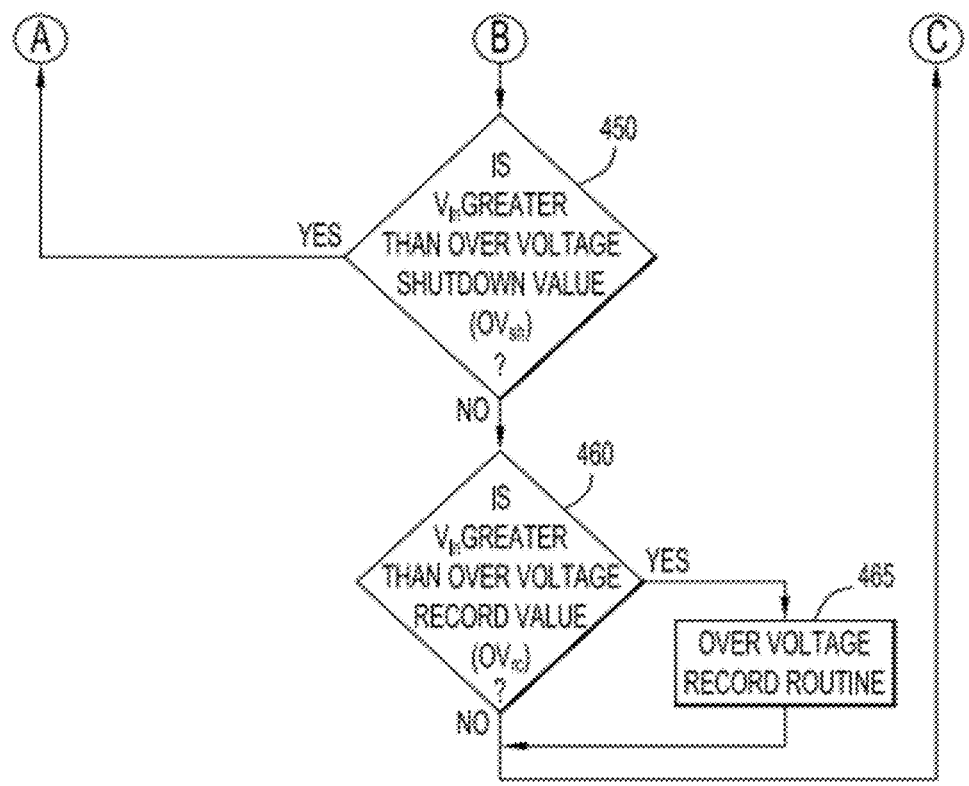

FIGS. 4A and 4B depict a functional flow diagram summarizing one example of logic for implementing operation of the supply voltage monitoring device in response to supply voltage conditions. In operation 405, from a Start-Up condition, an A/D conversion of the received supply line-to-neutral voltage representation $V_{In}$ is performed by control circuit 130. It is determined in operation 410 whether the digital supply voltage signal $V_{In}$ is between the under voltage and over voltage restore threshold values ($UV_{rs} \leq V_{In} \leq OV_{rs}$). If so, the on-cycle routine (operation 415) is performed in which control circuit 130 supplies to switch circuit 140 a switch control signal in an "on" state that causes switch circuit 140 to turn on (conductive state) to connect the input supply line conductor to the output load line conductor, thereby passing power to the downstream device output receptacles and connecting load equipment to the AC power supply (i.e., the Normal Operation State). If not (i.e., if the supply voltage signal $V_{In}$ is outside of the restore threshold levels ($V_{In}>OV_{rs}$ or $V_{In}<UV_{rs}$), then the logic loops back to operation 405 and control circuit 130 continues to test the supply voltage signal $V_{In}$ until it is within these acceptable levels (i.e., $UV_{rs} \leq V_{In} \leq OV_{rs}$) before it executes the on-cycle routine and transitions to the Normal Operation State.

After execution of the on-cycle routine, A/D conversion continues to be periodically performed on the received supply voltage signal $V_{In}$ (operation 420). In operation 425, the supply voltage signal is compared to the under voltage shutdown threshold value $UV_{sh}$. If the supply voltage signal is less than the under voltage shutdown threshold ($V_{In}<UV_{sh}$), then the under voltage record routine (operation 430) and the off-cycle routine (operation 435) are executed to record the under voltage condition as described above and to cause switch circuit 140 to turn off (non-conductive state) to disconnect the input (supply) line conductor to the output (load) line conductor, thereby preventing power from passing to the downstream device output receptacles and disconnecting load equipment from the AC power supply. After execution of the off-cycle routine, the logic returns to the initial operation 405 in which the supply voltage signal $V_{In}$ is periodically compared to the restore thresholds.

If in operation 425 the supply voltage signal is not below the under voltage shutdown threshold ($V_{In} \geq UV_{sh}$), then the logic proceeds to operation 440 in which the voltage supply is compared to the under voltage record threshold value $UV_{rc}$. If the supply voltage signal is less than the under voltage record threshold ($V_{In}<UV_{rc}$), then the under voltage record routine (operation 445) is executed to record the under voltage condition as described above and the logic proceeds to operation 450 (FIG. 4B). If the supply voltage signal is not less than the under voltage record threshold ($V_{In} \geq UV_{rc}$), then the logic proceeds directly to operation 450 without performing the under voltage record routine.

In operation 450, the supply voltage signal is compared to the over voltage shutdown threshold value $OV_{sh}$. If the supply voltage signal is greater than the over voltage shutdown threshold ($V_{In}>OV_{sh}$), then the over voltage record routine (operation 455) and the off-cycle routine (operation 435) are executed to record the over voltage condition as described above and to cause switch circuit 140 to turn off (non-conductive state) to disconnect the input supply line conductor to the output load line conductor, thereby preventing power from passing to the downstream device output receptacles and disconnecting load equipment to the AC power supply. After execution of the off-cycle routine, the logic returns to the initial operation 405 in which the supply voltage signal $V_{In}$ is periodically compared to the restore thresholds.

If, in operation 450, the supply voltage signal is not greater than the under voltage shutdown threshold ($V_{In} \leq OV_{sh}$), then the logic proceeds to operation 460 in which the voltage supply is compared to the over voltage record threshold value $OV_{rc}$. If the supply voltage signal is greater than the over voltage record threshold ($V_{In}>OV_{rc}$), then the over voltage record routine (operation 465) is executed to record the over voltage condition as described above and the logic proceeds to operation 420 to repeat the comparison cycle with the switch circuit remaining in the closed (connected) state. If the supply voltage signal is not greater than the over voltage record threshold ($V_{In} \leq OV_{rc}$), then the logic proceeds directly to operation 415 without performing the over voltage record routine.

Figure 5:
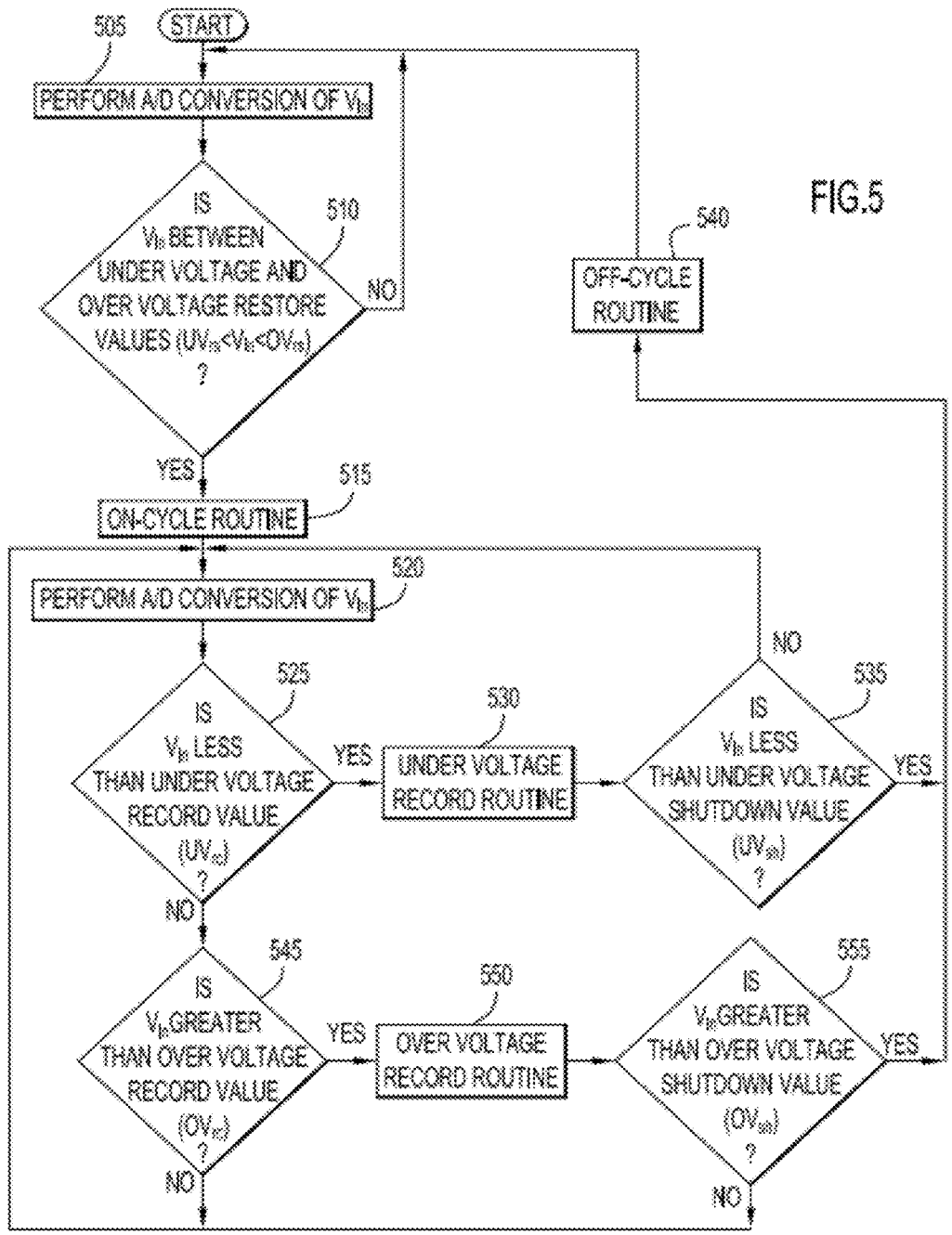
FIG. 5 depict a functional flow diagram of another example of logic for implementing operation of the supply voltage monitoring device of FIG. 1 in response to supply voltage conditions.

FIG. 5 depicts a functional flow diagram of another example of logic for implementing operation of the supply voltage monitoring device in response to supply voltage conditions. In operation 505, from a Start-Up condition, an A/D conversion of the received supply line-to-neutral voltage representation $V_{In}$ is performed. It is determined in operation 510 whether the supply voltage signal $V_{In}$ is between the under voltage and over voltage restore threshold values ($UV_{rs} \leq V_{In} \leq OV_{rs}$). If so, the on-cycle routine (operation 515) is performed in which control circuit 130 supplies to switch circuit 140 a switch control signal in an "on" state that causes switch circuit 140 to turn on (conductive state) to connect the input supply line conductor to the output load line conductor, thereby passing power to the downstream device output receptacles and connecting load equipment to the AC power supply (i.e., the Normal Operation State). If not (i.e., if the supply voltage signal $V_{In}$ is outside of the restore threshold levels ($V_{In}>OV_{rs}$ or $V_{In}<UV_{rs}$), then the logic loops back to operation 505 and control circuit 130 continues to test the supply voltage signal $V_{In}$ until it is within these acceptable levels (i.e., $UV_{rs} \leq V_{In} \leq OV_{rs}$) before it executes the on-cycle routine and transitions to the Normal Operation State.

After execution of the on-cycle routine, A/D conversion continues to be periodically performed on the received supply voltage signal $V_{In}$ (operation 520). In operation 525, the voltage supply is compared to the under voltage record threshold value $UV_{rc}$. If the supply voltage signal is less than the under voltage record threshold ($V_{In}<UV_{rc}$), then the under voltage record routine (operation 530) is executed to record the under voltage condition as described above and the logic proceeds to operation 535 in which the supply voltage signal is compared to the under voltage shutdown threshold value $UV_{sh}$. If the supply voltage signal is less than the under voltage shutdown threshold ($V_{In}<UV_{sh}$), then the off-cycle routine (operation 540) is executed to record the under voltage condition as described above and to cause switch circuit 140 to turn off (non-conductive state) to disconnect the input supply line conductor to the output load line conductor, thereby preventing power from passing to the downstream device output receptacles and disconnecting load equipment to the AC power supply. If control circuit 130 separately tracks falling below the under voltage shutdown threshold from falling below the under voltage record threshold, then control circuit 130 also executes the under voltage record routine (not shown in FIG. 5) along with the off-cycle routine. After execution of the off-cycle routine, the logic returns to the initial operation 505 in which the supply voltage signal $V_{In}$ is periodically compared to the restore thresholds.

If, in operation 535, the supply voltage signal is not greater than the under voltage shutdown threshold ($V_{In} \geq UV_{sh}$), then the logic loops back to operation 520 to repeat the comparison cycle between the supply voltage signal and the various thresholds, with the switch circuit remaining in the closed (conductive) state.

If in operation 525 the supply voltage signal is not less than the under voltage record threshold ($V_{In} \geq UV_{rc}$), then the logic proceeds to operation 545 in which the supply voltage signal is compared to the over voltage record threshold value $OV_{rc}$. If the supply voltage signal is greater than the over voltage record threshold ($V_{In}>OV_{rc}$), then the over voltage record routine (operation 550) is executed to record the over voltage condition as described above and the logic proceeds to operation 555 in which the supply voltage signal is compared to the over voltage shutdown threshold value $OV_{sh}$. If the supply voltage signal is greater than the over voltage shutdown threshold ($V_{In}>OV_{sh}$), then the off-cycle routine (operation 540) is executed to record the over voltage condition as described above and to cause switch circuit 140 to turn off (non-conductive state) to disconnect the input supply line conductor to the output load line conductor, thereby preventing power from passing to the downstream device output receptacles and disconnecting load equipment to the AC power supply. If control circuit 130 separately tracks exceeding the over voltage shutdown threshold from exceeding the over voltage record threshold, then control circuit 130 also executes the over voltage record routine (not shown in FIG. 5) along with the off-cycle routine. After execution of the off-cycle routine, the logic returns to the initial operation 505 in which the supply voltage signal $V_{In}$ is periodically compared to the restore thresholds.

If, in operation 555, the supply voltage signal is not greater than the over voltage shutdown threshold ($V_{In} \leq OV_{sh}$), then the logic loops back to operation 520 to repeat the comparison cycle between the supply voltage signal and the various thresholds, with the switch circuit remaining in the closed (conductive) state.

If, in operation 545, the supply voltage signal is not greater than the over voltage record threshold ($V_{In} \leq OV_{rc}$), then the logic loops back to operation 520 to repeat the comparison cycle between the supply voltage signal and the various thresholds with the switch circuit remaining in the closed (conductive) state. It will be appreciated from FIGS. 4A, 4B, and 5 that the invention is not limited to any one specific implementation, and a variety of different logic operations can be carried out to implement the invention.

Having separate record and shutdown levels allows for the recording of over and under voltage conditions that may be disruptive to connected equipment (i.e., creating a history of over and under voltage events) without actually disconnecting power to connected equipment (i.e., shutting down connected equipment). Supply voltage levels that may be damaging to connected equipment (i.e., outside the shutdown thresholds) can be addressed by recording the event and disconnecting and protecting connected equipment.

As shown in FIG. 1, the on-board Serial Communication Interface (SCI) module allows control circuit 130 to transmit information such as the status of device 100 and event history (e.g., over voltage and under voltage counts) to an external device (e.g., a computer, a microcontroller, a memory device, etc) for storage and analysis. In addition to transmitting data from device 100 to an external device, the SCI module allows for transmission of data, such as device control parameters, from an external device to the filter device. For example, according to one option, an external device can supply over and under voltage threshold values to control circuit 130, which can override or replace previously stored or default values.

In one embodiment, for instance, device 100 can be interfaced to a computer running a program (e.g., quick basic or C program) which, among other things, allows the end user to select from a list of over and under voltage threshold levels. These user-selected thresholds are then transmitted to control circuit 130. Control circuit 130 then replaces or overwrites previous used or default thresholds with the end user selected thresholds. Because device 100 is designed to protect a variety of sensitive equipment, this feature allows the end-user to customize the record and shutdown thresholds to be compatible with connected equipment.

According to another feature, control circuit 130 can also be programmed to perform routines in response to interrupts. In one implementation, control circuit 130 is configured, using the onboard timer module, to trigger a timer interrupt and perform an "increment time" routine every 1 second. In this case, control circuit 130 executes the operations shown in the flowchart of FIGS. 4A-4B or FIG. 5 and is interrupted every second to perform an "increment time" routine which keeps track of elapsed time (seconds, minutes, hours, and days) since the most recent recorded event (over voltage, under voltage, power outage or surge event). Thus, in response to one of the above power disturbances, in addition to incrementing and storing the applicable event count, control circuit 130 also stores the elapsed time since the previous event (i.e., time between events).

By using the serial communication interface to connect control circuit 130 to a computer running custom diagnostic software, the event data (event count and elapsed time between events) can be analyzed, displayed, and stored. By using windows time, and by recording the elapsed time between the most recent event and connection to the computer, the custom diagnostic software can perform computations on previously recorded events and convert the recorded time between events to actual time/date of occurrence (time stamp).

It will be appreciated that the above-described control circuit 130 represents just one possible implementation, and numerous other approaches employing a variety of hardware, software, firmware, and combinations thereof can be used to evaluate and respond to over voltage conditions and under voltage conditions.

Figure 6:
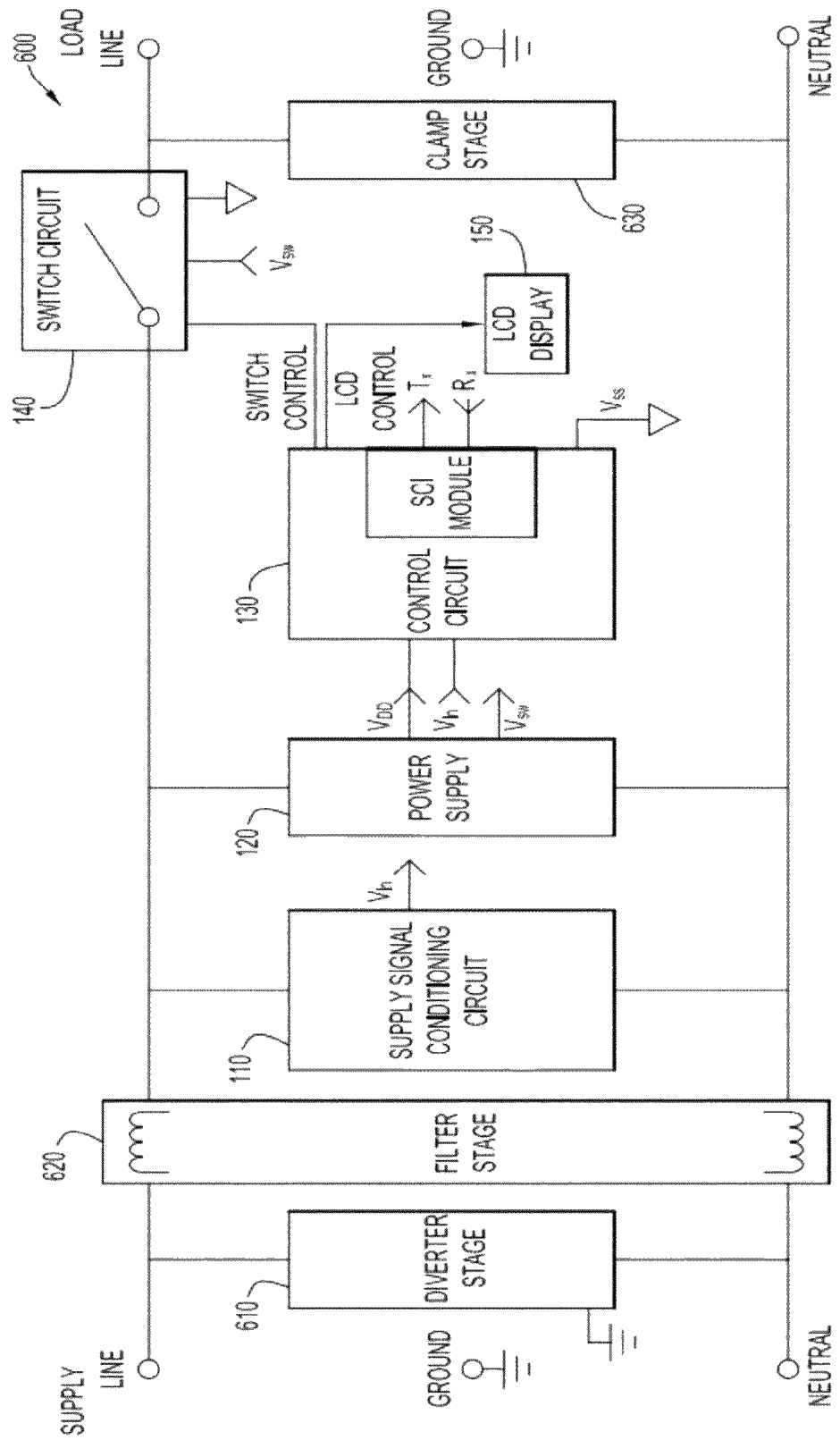
FIG. 6 is a diagrammatic illustration of an embodiment of the power filter circuit including the supply voltage monitoring device of FIG. 1.

FIG. 6 illustrates a complete power filter circuit 600 which includes the components of the supply voltage monitoring device 100 shown in FIG. 1 in conjunction with other power filtering circuitry. Power filter circuit 600 can be a cord-connected, micro-controller based, hybrid filter (surge suppressor, EMI filter) that suppresses AC mains transients and EMI, thereby protecting connected equipment from transient/noise related damage and disruption. A diverter stage 610 is connected to the input line, neutral, and ground conductors, followed by a filter stage 620 connected between the input line and neutral conductors (i.e., upstream of the supply voltage monitoring components). These stages function to suppress voltage transients and EMI/RFI disturbances. A clamp stage 630 connected to the output line, neutral, and ground conductors is located downstream of the switch circuit 140 and serves to eliminate any residual voltage transients prior to passing the filtered power to the connected equipment. Optionally, the control circuitry that controls the state of switch circuit 140 can also control the state of a relay that connects and disconnects clamp stage 630 to and from the neutral conductor in unison to protect components of clamp stage 630. Diverter stage 610, filter stage 620, and clamp stage 630 can be similar to those disclosed in U.S. Pat. No. 5,136,455, for example, the disclosure of which is hereby incorporated by reference in its entirety.

In this implementation, in addition to monitoring over voltage and under voltage conditions, control circuit 130 can monitor other types of supply voltage disturbances or irregularities. For example, control circuit 130 can also evaluate whether there is a wiring fault such as an open ground or a reverse polarity condition (i.e., line and neutral reversed). Further, over temperature conditions and over current conditions can be monitored by control circuit 130. If a power disturbance occurs, control circuit can increment the relevant power disturbance count and store the count in memory.

Optionally, control circuit 130 can display information about the power disturbance on display 150 (e.g., the type of wiring fault, etc.). When appropriate, control circuit 130 can also signal switch circuit 140 to disconnect power to the device output receptacles and protected equipment. In response, switch circuit 140 makes or breaks continuity of the line conductor with the connected equipment on the load side depending on whether one of the undesirable operating conditions has been detected (e.g., an overvoltage condition, an under-voltage, a wiring fault, an over-temperature condition, an over-current condition, etc.).

Having described preferred embodiments of new and improved supply voltage monitor, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

What is claimed is:

1. A supply voltage monitoring device for monitoring over voltage conditions of an AC power supply, comprising:
   a switch circuit configured to couple an input conductor connectable to the AC power supply to an output conductor connectable to a load, the switch circuit being controllable into a conductive state, where the input conductor is electrically connected to the output conductor through the switch circuit, and controllable into a non-conductive state, where the input conductor is electrically disconnected from the output conductor by the switch circuit;
   a supply signal conditioning circuit configured to generate a supply voltage signal representative of a voltage of the AC power supply; and
   a control circuit configured to monitor the supply voltage signal and to:
      control the switch circuit into the conductive state in response to the supply voltage signal being below a first over voltage threshold while the switch circuit is in the non-conductive state;
      record an indication of an occurrence of an over voltage event and control the switch circuit to remain in the conductive state in response to the supply voltage signal exceeding a second over voltage threshold that is higher than the first over voltage threshold while the switch circuit is in the conductive state; and
      control the switch circuit into the non-conductive state in response to the supply voltage signal exceeding a third over voltage threshold that is higher than the second over voltage threshold while the switch circuit is in the conductive state.

2. The supply voltage monitoring device of claim 1, wherein the control circuit is further configured to record an indication of the occurrence of another over voltage event in response to the supply voltage signal exceeding the third over voltage threshold while the switch circuit is in the conductive state.

3. The supply voltage monitoring device of claim 2, wherein the control circuit records the indication of the occurrence of the over voltage event or the other over voltage event by incrementing an over voltage event counter.

4. The supply voltage monitoring device of claim 3, wherein the control circuit is further configured to record an indication of a time at which the over voltage event or the other over voltage event occurred.

5. The supply voltage monitoring device of claim 3, wherein the control circuit is further configured to increment the over voltage event counter in response to the supply voltage signal exceeding the second over voltage threshold and to increment another over voltage event counter in response to the supply voltage signal exceeding the third over voltage threshold.

6. The supply voltage monitoring device of claim 1, wherein the control circuit is further configured to:
   control the switch circuit into the conductive state in response to the supply voltage signal exceeding a first under voltage threshold while the switch circuit is in the non-conductive state;
   record an indication of an occurrence of an under voltage event and control the switch circuit to remain in the conductive state in response to the supply voltage signal being below a second under voltage threshold that is lower than the first under voltage threshold while the switch circuit is in the conductive state; and
   control the switch circuit into the non-conductive state in response to the supply voltage signal being below a third under voltage threshold that is lower than the second under voltage threshold while the switch circuit is in the conductive state.

7. The supply voltage monitoring device of claim 6, wherein the control circuit is further configured to record an indication of the occurrence of another under voltage event in response to the supply voltage signal being below the third under voltage threshold while the switch circuit is in the conductive state.

8. The supply voltage monitoring device of claim 7, wherein the control circuit records the indication of the occurrence of the under voltage event or the other under voltage event by incrementing an under voltage event counter.

9. The supply voltage monitoring device of claim 8, wherein the control circuit is further configured to record an indication of a time at which the under voltage event or the other under voltage event occurred.

10. The supply voltage monitoring device of claim 8, wherein the control circuit is further configured to increment the under voltage event counter in response to the supply voltage signal falling below the second under voltage threshold and to increment another under voltage event counter in response to the supply voltage signal falling below the third under voltage threshold.

11. The supply voltage monitoring device of claim 6, wherein the control circuit is further configured to record the indication of the occurrence of the under voltage event only once in response to any occurrence of the supply voltage signal falling below the second under voltage threshold that precedes an occurrence of the supply voltage signal exceeding the first under voltage threshold.

12. The supply voltage monitoring device of claim 1, wherein the control circuit is further configured to record the indication of the occurrence of the over voltage event only once in response to any occurrence of the supply voltage signal exceeding the second over voltage threshold that precedes an occurrence of the supply voltage signal falling below the first over voltage threshold.

13. A method of monitoring voltage conditions of an AC power supply with a supply voltage monitoring device comprising a switch circuit configured to couple an input conductor connectable to the AC power supply to an output conductor connectable to a load, the switch circuit being controllable into a conductive state, where the input conductor is electrically connected to the output conductor through the switch circuit, and controllable into a non-conductive state, where the input conductor is electrically disconnected from the output conductor by the switch circuit, the method comprising:
   generating a supply voltage signal representative of a voltage of the AC power supply;
   controlling the switch circuit into the conductive state in response to the supply voltage signal being below a first over voltage threshold while the switch circuit is in the non-conductive state;

recording an indication of an occurrence of an over voltage event and controlling the switch circuit to remain in the conductive state in response to the supply voltage signal exceeding a second over voltage threshold that is higher than the first over voltage threshold while the switch circuit is in the conductive state; and controlling the switch circuit into the non-conductive state in response to the supply voltage signal exceeding a third over voltage threshold that is higher than the second over voltage threshold while the switch circuit is in the conductive state.

14. The method of claim 13, further comprising:

recording an indication of an occurrence of another over voltage event in response to the supply voltage signal exceeding the third over voltage threshold while the switch circuit is in the conductive state.

15. The method of claim 14, wherein recording the indication of the occurrence of the over voltage event or the other over voltage event includes incrementing an over voltage event counter and recording an indication of a time at which the over voltage event or the other over voltage event occurred.

16. The method of claim 13, further comprising:

controlling the switch circuit into the conductive state in response to the supply voltage signal exceeding a first under voltage threshold while the switch circuit is in the non-conductive state;

recording an indication of an occurrence of an under voltage event and controlling the switch circuit to remain in the conductive state in response to the supply voltage signal being below a second under voltage threshold that is lower than the first under voltage threshold while the switch circuit is in the conductive state; and controlling the switch circuit into the non-conductive state in response to the supply voltage signal being below a third under voltage threshold that is lower than the second under voltage threshold while the switch circuit is in the conductive state.

17. The method of claim 16, further comprising:

recording an indication of an occurrence of another under voltage event in response to the supply voltage signal being below the third under voltage threshold while the switch circuit is in the conductive state.

18. The method of claim 17, wherein recording the indication of the occurrence of the under voltage event or the other under voltage event includes incrementing an under voltage event counter and recording an indication of a time at which the under voltage event or the other under voltage event occurred.

19. A non-transitory computer readable medium encoded with software comprising computer executable instructions that, when executed by a processor, cause the processor to perform functions of:

comparing a supply voltage signal representative of a voltage of an AC power supply to a plurality of over voltage thresholds;

controlling a switch circuit from a non-conductive state into a conductive state in response to the supply voltage signal being below a first over voltage threshold such that an input conductor connectable to the AC power supply is electrically connected through the switch circuit to an output conductor connectable to a load;

recording an indication of an occurrence of an over voltage event and controlling the switch circuit to remain in the conductive state in response to the supply voltage signal exceeding a second over voltage threshold that is higher than the first over voltage threshold; and controlling the switch circuit from the conductive state into the non-conductive state in response to the supply voltage signal exceeding a third over voltage threshold that is higher than the second over voltage threshold such that the input conductor is electrically disconnected from the output conductor by the switch.

20. The non-transitory computer readable medium of claim 19, encoded with software comprising further computer executable instructions that, when executed by the processor, cause the processor to perform the further functions of:

comparing the supply voltage signal to a plurality of under voltage thresholds;

controlling the switch circuit from the non-conductive state into the conductive state in response to the supply voltage signal exceeding a first under voltage threshold;

recording an indication of an occurrence of another under voltage event and controlling the switch circuit to remain in the conductive state in response to the supply voltage signal being below a second under voltage threshold that is lower than the first under voltage threshold; and controlling the switch circuit from the conductive state into the non-conductive state in response to the supply voltage signal being below a third under voltage threshold that is lower than the second under voltage threshold.

* * * * *